(12) United States Patent
Sugimoto et al.

(10) Patent No.: US 10,199,418 B2
(45) Date of Patent: Feb. 5, 2019

(54) SEMICONDUCTOR PHOTODETECTION DEVICE

(71) Applicant: HAMAMATSU PHOTONICS K.K., Hamamatsu-shi, Shizuoka (JP)

(72) Inventors: Kenichi Sugimoto, Hamamatsu (JP); Hiroya Kobayashi, Hamamatsu (JP); Kentaro Maeta, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/766,336

(22) PCT Filed: Oct. 17, 2013

(86) PCT No.: PCT/JP2013/078221
§ 371 (c)(1),
(2) Date: Aug. 6, 2015

(87) PCT Pub. No.: WO2014/132482
PCT Pub. Date: Sep. 4, 2014

(65) Prior Publication Data
US 2015/0380455 A1 Dec. 31, 2015

(30) Foreign Application Priority Data
Feb. 28, 2013 (JP) .................................. 2013-039333

(51) Int. Cl.
*H01L 27/146* (2006.01)
*H01L 23/00* (2006.01)
*H01L 23/498* (2006.01)

(52) U.S. Cl.
CPC ........ *H01L 27/14636* (2013.01); *H01L 24/14* (2013.01); *H01L 27/14601* (2013.01); *H01L 23/49838* (2013.01)

(58) Field of Classification Search
CPC ............... H01L 27/14636; H01L 24/14; H01L 27/14601; H01L 23/49838
USPC .................................. 257/292, 294, 431–436
See application file for complete search history.

(56) References Cited

U.S. PATENT DOCUMENTS 5,929,500 A * 7/1999 Yoneda ................ G02B 6/4214
257/432
7,436,682 B2 * 10/2008 Nishitani .......... H01L 23/49811
174/260

(Continued)

FOREIGN PATENT DOCUMENTS

CN          101010807        8/2007
DE          102008050840     10/2009
(Continued)

OTHER PUBLICATIONS

English-language translation of International Preliminary Report on Patentability (IPRP) dated Sep. 11, 2015 that issued in WO Patent Application No. PCT/JP2013/078221.

*Primary Examiner* — Su C Kim
*Assistant Examiner* — David S Wilbert
(74) *Attorney, Agent, or Firm* — Drinker Biddle & Reath LLP

(57) ABSTRACT

A plurality of semiconductor photodetecting elements have a planar shape having a pair of first sides opposed to each other in a first direction and a pair of second sides being shorter than the pair of first sides and opposed to each other in a second direction perpendicular to the first direction, and are disposed on a base so as to be adjacent to each other in juxtaposition. A plurality of bump electrodes each are disposed on sides where the pair of first sides lie in each (Continued)

semiconductor photodetecting element, to electrically and mechanically connect the base to each semiconductor photodetecting element. A plurality of dummy bumps are disposed so that at least one dummy bump is disposed on each of sides where the pair of second sides lie in each semiconductor photodetecting element, to mechanically connect the base to each semiconductor photodetecting element.

12 Claims, 11 Drawing Sheets

(56) References Cited

U.S. PATENT DOCUMENTS

| | | | |
|---|---|---|---|
| 2003/0106987 A1* | 6/2003 | Komaba | H01L 27/14623 250/208.1 |
| 2004/0012684 A1 | 1/2004 | Tinnerino | |
| 2005/0242380 A1* | 11/2005 | Suzuki | H04N 5/32 257/292 |
| 2006/0180928 A1 | 8/2006 | Takahira | |
| 2007/0119618 A1 | 5/2007 | Nishitani et al. | |
| 2009/0108181 A1* | 4/2009 | Ishihara | H01L 27/14623 250/214.1 |
| 2012/0132817 A1* | 5/2012 | Shaw | G01T 1/2018 250/369 |

FOREIGN PATENT DOCUMENTS

| | | |
|---|---|---|
| JP | H06-112463 A | 4/1994 |
| JP | 2000-022120 A | 1/2000 |
| JP | 2000-278605 A | 10/2000 |
| JP | 2002-026302 A | 1/2002 |
| JP | 2006-287640 A | 10/2006 |
| JP | 2012-009607 A | 1/2012 |
| JP | 2013-004715 | 1/2013 |

* cited by examiner

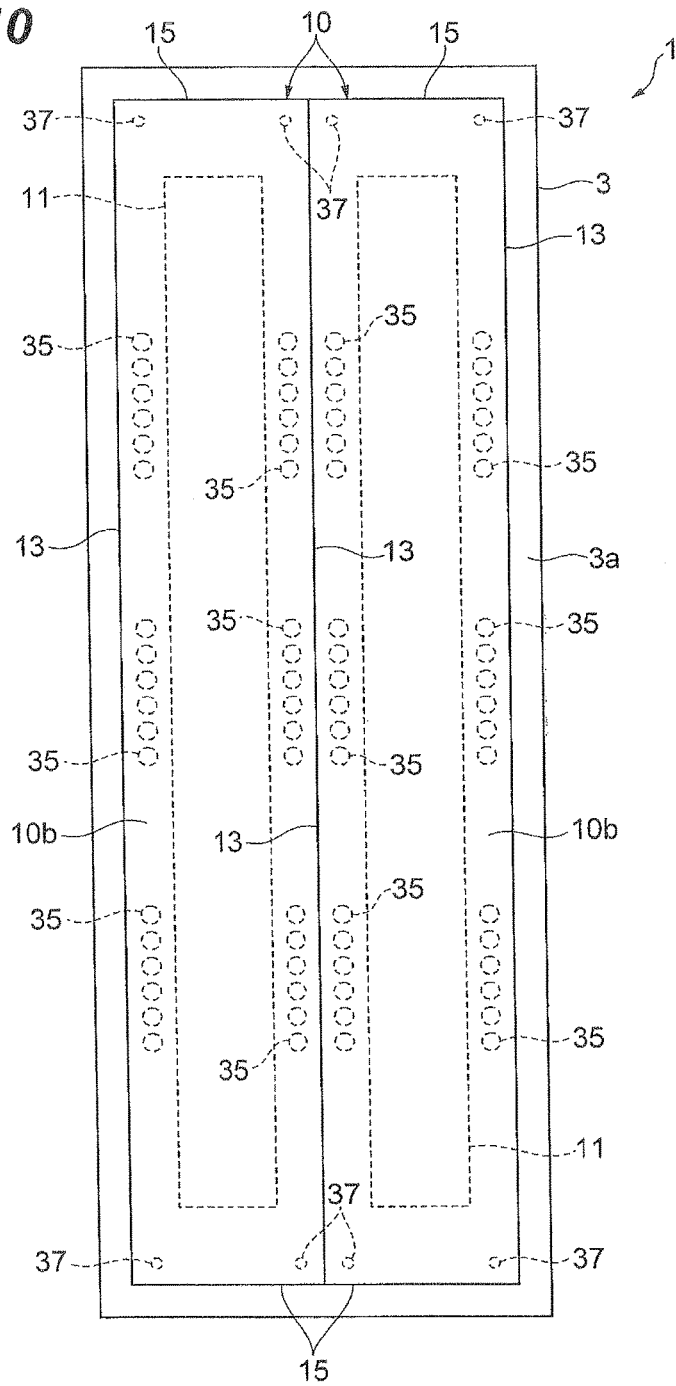

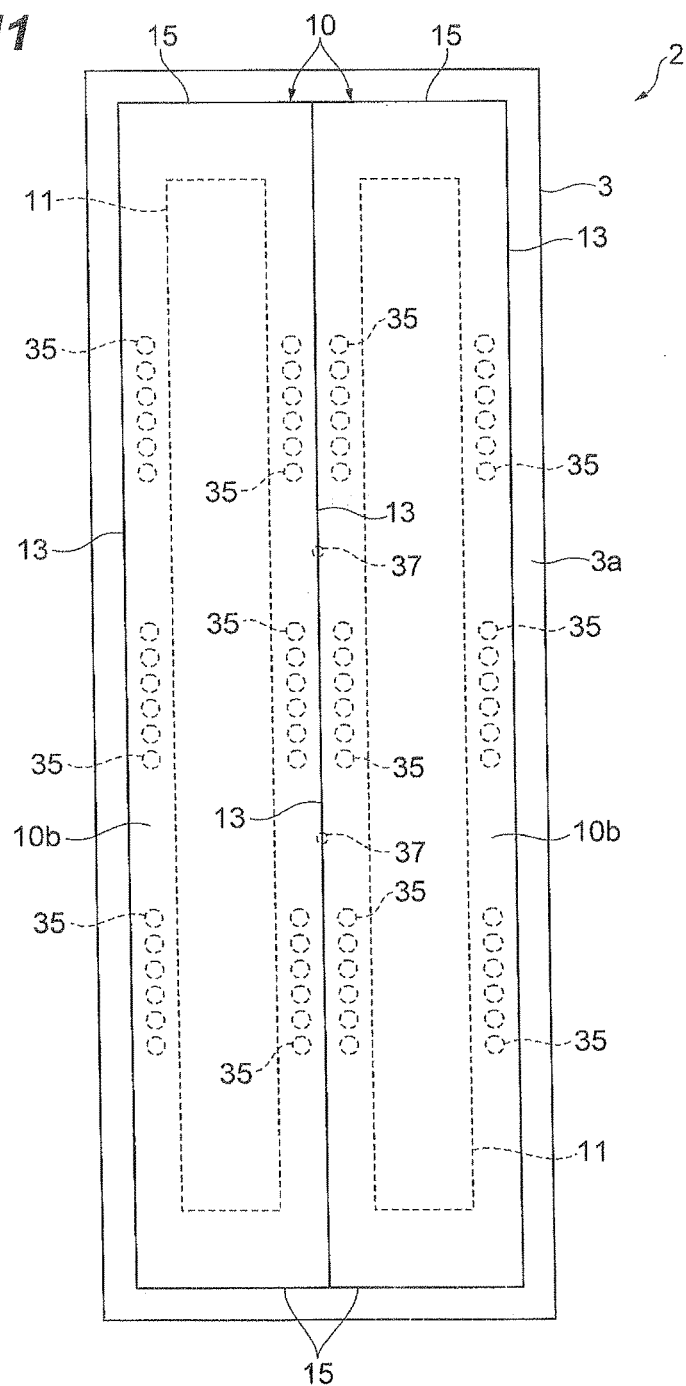

SEMICONDUCTOR PHOTODETECTION DEVICE

TECHNICAL FIELD

The present invention relates to a semiconductor photodetecting device including a plurality of semiconductor photodetecting elements.

BACKGROUND ART

There is a known semiconductor photodetecting device including a base, a plurality of semiconductor photodetecting elements disposed on the base, and a plurality of bump electrodes electrically and mechanically connecting the base and each semiconductor photodetecting element (e.g., cf. Patent Literature 1). The plurality of semiconductor photodetecting elements have a planar shape having a pair of first sides opposed to each other in a first direction and a pair of second sides opposed to each other in a second direction perpendicular to the first direction. The plurality of semiconductor photodetecting elements are disposed on the base so as to be adjacent to each other in juxtaposition.

CITATION LIST

Patent Literature

Patent Literature 1: Japanese Patent Application Laid-open Publication No. 2000-022120 (Paragraph [0146])

SUMMARY OF INVENTION

Technical Problem

However, the semiconductor photodetecting device described in Patent Literature 1 may have the problem as described below. The base and the plurality of semiconductor photodetecting elements are mechanically connected to each other when the bump electrodes become hardened. At this time, each semiconductor photodetecting element may suffer positional deviation due to a factor such as contraction of the bump electrodes occurring during the hardening process of the bump electrodes.

In the semiconductor photodetecting element having the planar shape with the pair of second sides shorter than the pair of first sides, a plurality of contact pads to which the corresponding bump electrodes are connected are disposed on the sides where the pair of first sides lie, in order to reduce the wiring capacity by use of shorter wires to the contact pads. At this time, in order to further reduce the wiring capacity, the plurality of contact pads are disposed at positions relatively distant from the second sides, when viewed in the second direction, in some cases. When the plurality of contact pads, i.e., the plurality of bump electrodes are disposed on the sides where the pair of first sides lie, the positional deviation of the semiconductor photodetecting element may increase on the sides where the second sides lie, during the contraction of these bump electrodes.

It is an object of the present invention to provide a semiconductor photodetecting device in which a plurality of semiconductor photodetecting elements are disposed with high position accuracy.

Solution to Problem

A semiconductor photodetecting device according to one aspect of the present invention includes a base; a plurality of semiconductor photodetecting elements that have a planar shape having a pair of first sides opposed to each other in a first direction and a pair of second sides being shorter than the pair of first sides and opposed to each other in a second direction perpendicular to the first direction, and that are disposed on the base so as to be adjacent to each other in juxtaposition; a plurality of bump electrodes each disposed on sides where the pair of first sides lie in each semiconductor photodetecting element, to electrically and mechanically connect the base and each semiconductor photodetecting element; and a plurality of dummy bumps disposed so that at least one dummy bump is disposed on each of sides where the pair of second sides lie in each semiconductor photodetecting element, to mechanically connect the base and each semiconductor photodetecting element.

In the semiconductor photodetecting device according to the one aspect of the present invention, at least one dummy bump is disposed on each of the sides where the pair of second sides lie in each semiconductor photodetecting element. Even if each semiconductor photodetecting element comes close to undergoing the positional deviation due to the factor such as the contraction of the plurality of bump electrodes, each semiconductor photodetecting element will be prevented from suffering the positional deviation, because the dummy bumps are disposed one on each of the sides where the pair of second sides lie. Therefore, the plurality of semiconductor photodetecting elements are disposed with high position accuracy.

Each semiconductor photodetecting element may be adjacent to another in juxtaposition in the first direction. When each semiconductor photodetecting element is disposed so as to be adjacent to another in juxtaposition in the first direction, it can undergo positional deviation due to a factor such as interference between the semiconductor photodetecting elements. However, since the dummy bumps are disposed one on each of the sides where the pair of second sides lie, even if each semiconductor photodetecting element comes close to undergoing the positional deviation due to the factor such as the interference between the semiconductor photodetecting elements in the configuration wherein each semiconductor photodetecting element is disposed so as to be adjacent to another in juxtaposition in the first direction, occurrence of the positional deviation can be securely prevented.

The plurality of dummy bumps may be disposed so as to lie on the plurality of adjacent semiconductor photodetecting elements. In this case, the plurality of dummy bumps are shared among the adjacent semiconductor photodetecting elements. As a result, the number of dummy bumps can be made relatively small and thus increase in cost can be suppressed.

The semiconductor photodetecting device may further include at least one dummy bump that is disposed so as to lie on each semiconductor photodetecting element on a side where sides adjacent to each other lie in the plurality of adjacent semiconductor photodetecting elements, out of the first sides and the second sides, to mechanically connect the base and each semiconductor photodetecting element. In this case, each semiconductor photodetecting element is further prevented from suffering the positional deviation and thus the plurality of semiconductor photodetecting elements are disposed with higher position accuracy.

A semiconductor photodetecting device according to another aspect of the present invention includes a base; a plurality of semiconductor photodetecting elements that have a planar shape having a pair of first sides opposed to each other in a first direction and a pair of second sides opposed to each other in a second direction perpendicular to the first direction, and that are disposed on the base so as to be adjacent to each other in juxtaposition in the first direction; a plurality of bump electrodes each disposed on sides where the pair of first sides lie in each semiconductor photodetecting element, to electrically and mechanically connect the base and each semiconductor photodetecting element; and a plurality of dummy bumps disposed so as to lie on each semiconductor photodetecting element on sides where the first sides adjacent to each other lie in the plurality of adjacent semiconductor photodetecting elements, to mechanically connect the base and each semiconductor photodetecting element.

In the semiconductor photodetecting device according to the other aspect of the present invention, the plurality of dummy bumps are disposed so as to lie on each semiconductor photodetecting element on the sides where the first sides adjacent to each other lie in the plurality of adjacent semiconductor photodetecting elements. Even if each semiconductor photodetecting element comes close to undergoing the positional deviation due to the factor such as the contraction of the plurality of bump electrodes, each semiconductor photodetecting element will be prevented from suffering the positional deviation, because the dummy bumps are disposed each so as to lie on each semiconductor photodetecting element on the sides where the first sides lie. Therefore, the plurality of semiconductor photodetecting elements are disposed with high position accuracy.

A plurality of contact pads that are formed by the same manufacturing process and to which the plurality of bump electrodes and the plurality of dummy bumps are connected may be disposed on the plurality of semiconductor photodetecting elements. In this case, position accuracy is kept extremely high for the contact pads to which the bump electrodes are connected and for the contact pads to which the dummy bumps are connected. Therefore, the plurality of semiconductor photodetecting elements can be disposed with higher position accuracy.

The plurality of bump electrodes may be solder bumps, and the plurality of dummy bumps may be solder bumps with a melting point lower than that of the plurality of bump electrodes. In this case, the bump electrodes start hardening earlier than the dummy bumps, but the bump electrodes become hardened with each semiconductor photodetecting element being in alignment because the dummy bumps are still in a molten state. Therefore, each semiconductor photodetecting element can be further prevented from suffering the positional deviation.

The plurality of dummy bumps may be smaller than the plurality of bump electrodes. Not only the bump electrodes but also the dummy bumps contract during the hardening process. However, since the dummy bumps are smaller than the bump electrodes, a contraction percentage of the dummy bumps is smaller and a force imposed on the semiconductor photodetecting elements during the contraction is very small. Therefore, each semiconductor photodetecting element can be securely prevented from suffering the positional deviation.

Each semiconductor photodetecting element may be a solid-state imaging device capable of acquiring a two-dimensional image with a longitudinal direction along the second direction and being driven by TDI driving.

Advantageous Effect of Invention

The present invention has successfully provided the semiconductor photodetecting device in which the plurality of semiconductor photodetecting elements were disposed with high position accuracy.

BRIEF DESCRIPTION OF DRAWINGS

FIG. 10 is a plan view showing a semiconductor photodetecting device according to a modification example of the first embodiment.

FIG. 11 is a plan view showing a semiconductor photodetecting device according to a modification example of the second embodiment.

DESCRIPTION OF EMBODIMENTS

Embodiments of the present invention will be described below in detail with reference to the accompanying drawings. Identical elements or elements with identical functionality will be denoted by the same reference signs in the description, without redundant description.

(First Embodiment)

Figure 1:
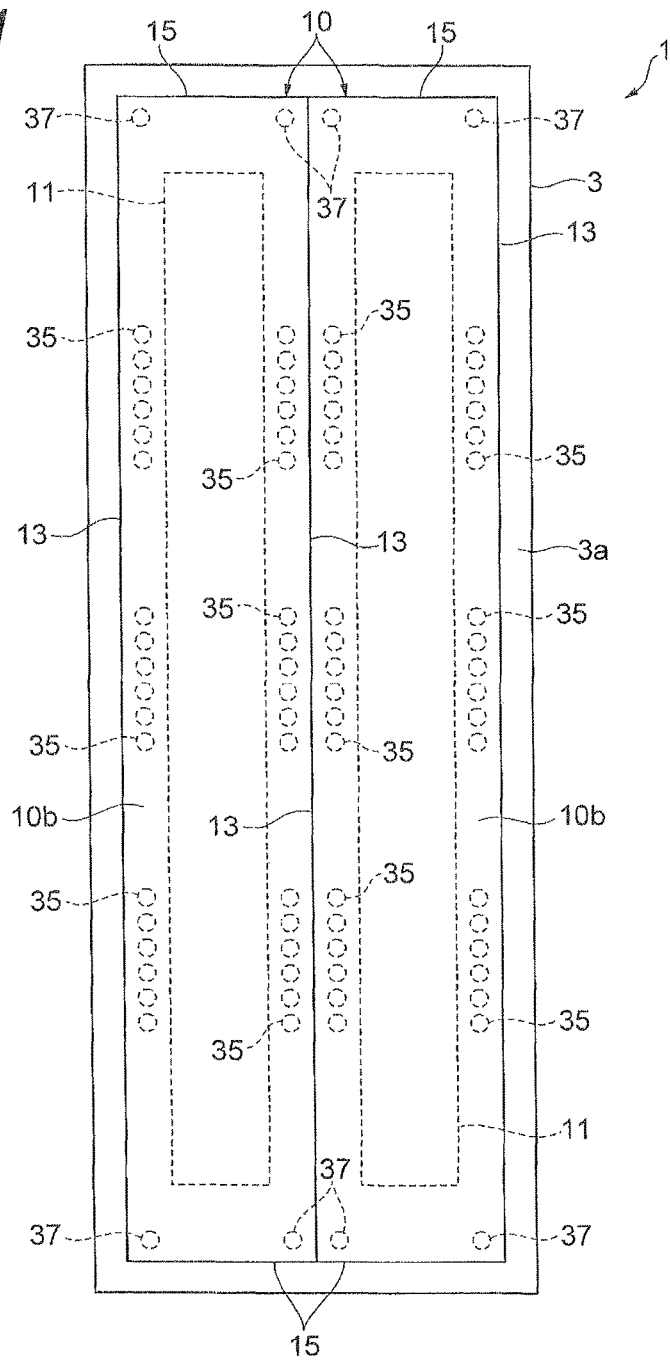
FIG. 1 is a plan view showing a semiconductor photodetecting device according to a first embodiment.
Figure 2:
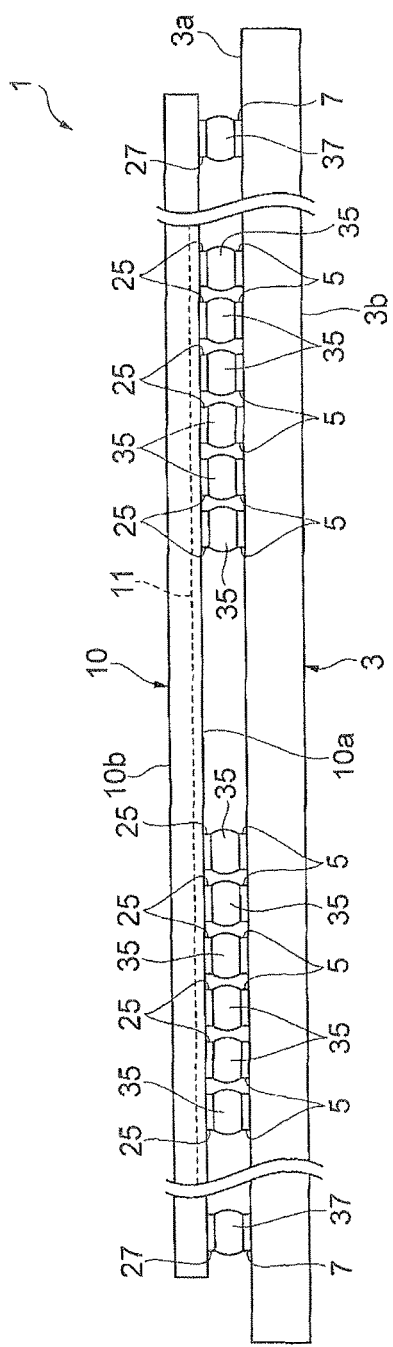
FIG. 2 is a drawing for explaining a cross-sectional configuration of the semiconductor photodetecting device according to the first embodiment.

A configuration of the semiconductor photodetecting device 1 according to the first embodiment will be described with reference to FIGS. 1 and 2. FIG. 1 is a plan view showing the semiconductor photodetecting device according to the first embodiment. FIG. 2 is a drawing for explaining a cross-sectional configuration of the semiconductor photodetecting device according to the first embodiment.

The semiconductor photodetecting device 1 has a base 3, and a plurality of semiconductor photodetecting elements 10, as shown in FIGS. 1 and 2. In the present embodiment, the semiconductor photodetecting device 1 has two semiconductor photodetecting elements 10.

The base 3 is a substrate that has principal surfaces 3a, 3b opposed to each other. A plurality of contact pads 5 and contact pads 7 are disposed on the principal surface 3a. The principal surface 3a is a surface for each semiconductor photodetecting element 10 to be disposed thereon. Namely, each semiconductor photodetecting element 10 is disposed on the principal surface 3a of the base 3.

Each semiconductor photodetecting element 10 has a principal surface 10a and a principal surface 10b opposed to each other. Each semiconductor photodetecting element 10 is provided with a photosensitive region 11 on the principal surface 10a side. The photosensitive region 11 generates an electric charge according to incident light. Each semiconductor photodetecting element 10 has a planar shape having a pair of first sides 13 opposed to each other in a first direction and a pair of second sides 15 being shorter than the pair of first sides 13 and opposed to each other in a second direction perpendicular to the first direction. The present embodiment is configured by adopting a rectangle shape as the foregoing planar shape. Namely, each first side 13 corresponds to a long side and each second side 15 to a short side. Therefore, the first direction is a direction parallel to the short sides and the second direction a direction parallel to the long sides.

In the present embodiment, the semiconductor photodetecting elements 10 used are BT (Back-illuminated Thinning)-CCDs (Charge Coupled Devices). Electric charges generated are transferred as signal charges by a shift register and are converted into voltages corresponding to the signal charges to be output. The semiconductor photodetecting elements 10 are driven by the TDI (Time Delay Integration) mode to implement the charge transfer in the first direction. Namely, the semiconductor photodetecting elements 10 are solid-state imaging devices capable of acquiring a two-dimensional image with the longitudinal direction along the second direction and being driven by the TDI driving. The semiconductor photodetecting device 1 (semiconductor photodetecting elements 10) images a subject relatively moving in the first direction.

Each semiconductor photodetecting element 10 is disposed on the base 3 so that a light entrance plane lies on the principal surface 10b side. The principal surfaces 10a of the semiconductor photodetecting elements 10 and the principal surface 3a of the base 3 are opposed to each other. Each semiconductor photodetecting element 10 is located so as to be adjacent to another in juxtaposition in the first direction on the principal surface 3a of the base 3.

Each semiconductor photodetecting element 10 has a plurality of contact pads 25 and contact pads 27. Each contact pad 25, 27 is disposed on the principal surface 10a side of the semiconductor photodetecting element 10. Each contact pad 25 is a contact pad for input/output of signal into or from the semiconductor photodetecting element 10. Each contact pad 27 is a contact pad that does not contribute to the input/output of signal into or from the semiconductor photodetecting element 10. The contact pads 27 are so-called dummy pads. Each contact pad 25, 27 is formed on the principal surface 10a side of the semiconductor photodetecting element 10 by the same manufacturing process.

The plurality of contact pads 25 are disposed each on the sides where the pair of first sides 13 lie in each semiconductor photodetecting element 10. The contact pads 25 are placed side by side along the first side 13 on each of the sides where the first sides 13 lie. For making the wiring distance shorter to decrease the wiring capacity, the contact pads 25 are disposed at positions relatively distant from the second sides 15, when viewed in the second direction. In the present embodiment, eighteen (6×3) contact pads 25 are provided on each of the sides where the first sides 13 lie.

The plurality of contact pads 27 are disposed each on the sides where the pair of second sides 15 lie in each semiconductor photodetecting element 10. In the present embodiment, they are placed side by side along the second side 15 on each of the sides where the second sides 15 lie. Each contact pad 27 is disposed at a position corresponding to a corner of the rectangle shape. In the present embodiment, two contact pads 27 are provided on each of the sides where the second sides 15 lie.

The plurality of contact pads 5 disposed on the base 3 are provided so that their positions are defined so as to correspond to the plurality of contact pads 25 on the semiconductor photodetecting elements 10. Each contact pad 5 is a contact pad for the input/output of signal into or from the semiconductor photodetecting element 10. In the present embodiment, seventy two (18×4) contact pads 5 are provided on the base 3.

The plurality of contact pads 7 disposed on the base 3 are provided so that their positions are defined so as to correspond to the plurality of contact pads 27 on the semiconductor photodetecting elements 10. Each contact pad 7 is a contact pad that does not contribute to the input/output of signal into or from the semiconductor photodetecting element 10. The contact pads 7 are so-called dummy pads as the contact pads 27 are. In the present embodiment, eight (4×2) contact pads 7 are provided on the base 3.

The semiconductor photodetecting device 1 has a plurality of bump electrodes 35 and a plurality of dummy bumps 37. Each semiconductor photodetecting element 10 is mounted on the base 3 by the plurality of bump electrodes 35 and dummy bumps 37. Namely, each semiconductor photodetecting element 10 is mounted on the base 3 by flip-chip bonding.

Each bump electrode 35 electrically and mechanically connects the base 3 and each semiconductor photodetecting element 10. Each dummy bump 37 mechanically connects the base 3 and each semiconductor photodetecting element 10. In the present embodiment, solder bumps are used as the bump electrodes 35 and the plurality of dummy pumps 37. A tin-silver-copper alloy (Sn—Ag—Cu) solder can be used for the solder bumps. The bump electrodes 35 and the plurality of dummy bumps 37 can also be made using bumps such as gold bumps, nickel bumps, or copper bumps, besides the solder bumps.

Each bump electrode 35 connects the contact pad 5 and the contact pad 25 corresponding to each other. Namely, the plurality of bump electrodes 35 are disposed each on the sides where the pair of first sides 13 lie in each semiconductor photodetecting element 10, corresponding to the contact pads 25. The bump electrodes 35 are placed side by side along the first side 13 on each of the sides where the first sides 13 lie. The number of bump electrodes 35 is the same as the number of contact pads 25 (or contact pads 5).

Each dummy bump 37 connects the contact pad 7 and the contact pad 27 corresponding to each other. Namely, the plurality of dummy bumps 37 are disposed each on the sides where the pair of second sides 15 lie in each semiconductor photodetecting element 10, corresponding to the contact pads 27. The dummy bumps 37 are placed side by side along the second side 15 on each of the sides where the second sides 15 lie. The number of dummy bumps 37 is the same as the number of contact pads 27 (or contact pads 7). Each dummy bump 37 does not contribute to the input/output of signal into or from the semiconductor photodetecting element 10.

In the present first embodiment, as described above, the dummy bumps 37 are disposed so that two dummy bumps 37 are disposed on each of the sides where the pair of second sides 15 lie in each semiconductor photodetecting element 10. Even if each semiconductor photodetecting element 10 comes close to undergoing the positional deviation due to a factor such as contraction of the plurality of bump electrodes 35, each semiconductor photodetecting element 10 will be prevented from suffering the positional deviation, because the dummy bumps 37 are disposed each on the sides where the pair of second sides 15 lie. Therefore, the two semiconductor photodetecting elements 10 are disposed with high position accuracy.

Each semiconductor photodetecting element 10 is adjacent to another in juxtaposition in the first direction. In this case, positional deviation can occur because of a factor such as interference between the semiconductor photodetecting elements 10. However, since the dummy bumps 37 are disposed each on the sides where the pair of second sides 15 lie, as described above, even if each semiconductor photodetecting element 10 comes close to undergoing the positional deviation due to the factor such as the interference between the semiconductor photodetecting elements 10, occurrence of the positional deviation can be securely prevented.

Each contact pad 25 and each contact pad 27 are formed by the same manufacturing process. For this reason, the position accuracy is kept extremely high for the contact pads 25 to which the bump electrodes 35 are connected and for the contact pads 27 to which the dummy bumps 37 are connected. Therefore, each semiconductor photodetecting element 10 can be disposed with higher position accuracy.

Each semiconductor photodetecting element 10 is the solid-state imaging device capable of being driven by the TDI driving, as described above, and a specific area of a subject is imaged by the same pixel row, among the semiconductor photodetecting elements 10. In this case, if there were positional deviation of each semiconductor photodetecting element 10, the specific area of the subject would be imaged by different pixel rows, among the semiconductor photodetecting elements 10. This would result in blurring an acquired image and degrading resolution eventually. In the present embodiment, however, each semiconductor photodetecting element 10 is disposed with high position accuracy while being prevented from undergoing the positional deviation, as described above, and thus the acquired image is prevented from being blurred, without degradation of resolution.

The below will describe configurations of the semiconductor photodetecting devices 1 according to modification examples of the first embodiment, with reference to FIGS. 3 to 7. FIGS. 3 to 7 are plan views showing the semiconductor photodetecting devices according to the modification examples of the first embodiment.

Figure 3:
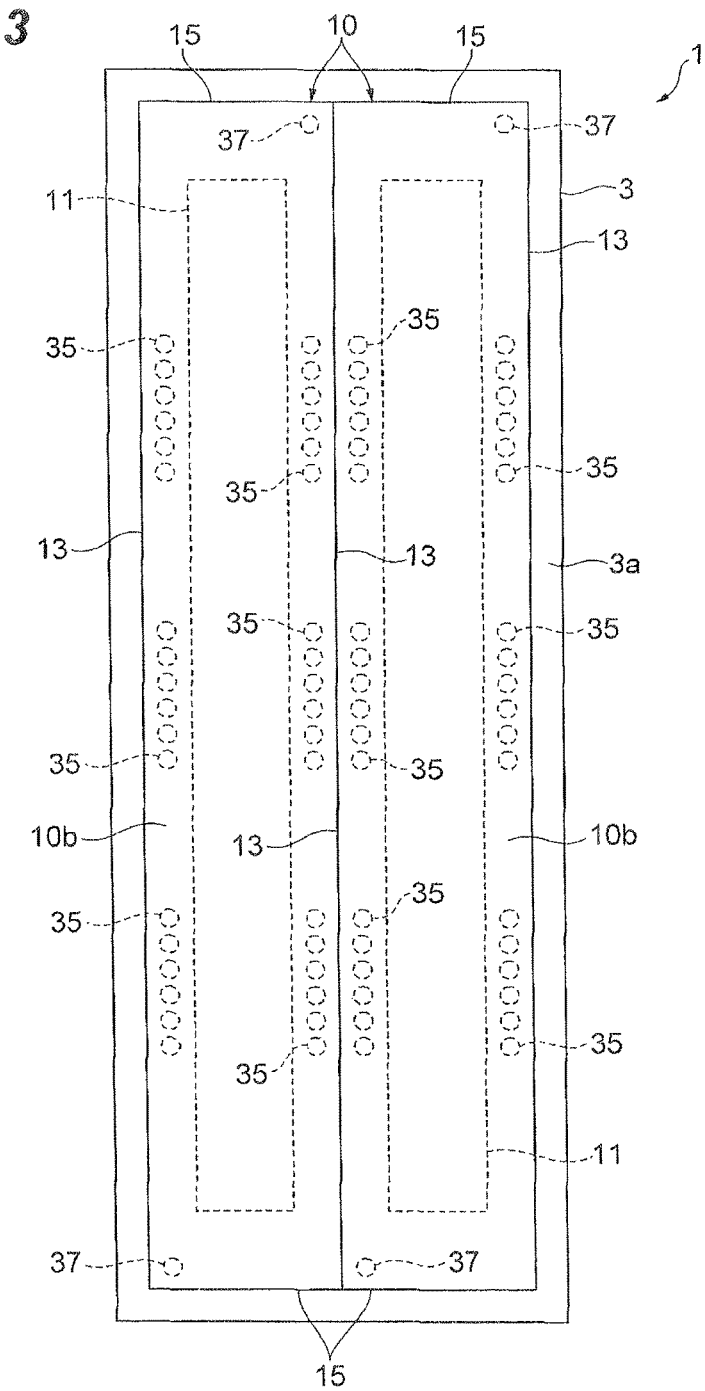
FIG. 3 is a plan view showing a semiconductor photodetecting device according to a modification example of the first embodiment.

In the modification example shown in FIG. 3, each dummy bump 37 is disposed so that one dummy bump 37 is disposed on each of the sides where the pair of second sides 15 lie. In the present modification example, each dummy bump 37 is disposed at one of positions corresponding to a pair of corners located on a diagonal of the rectangle shape.

Figure 4:
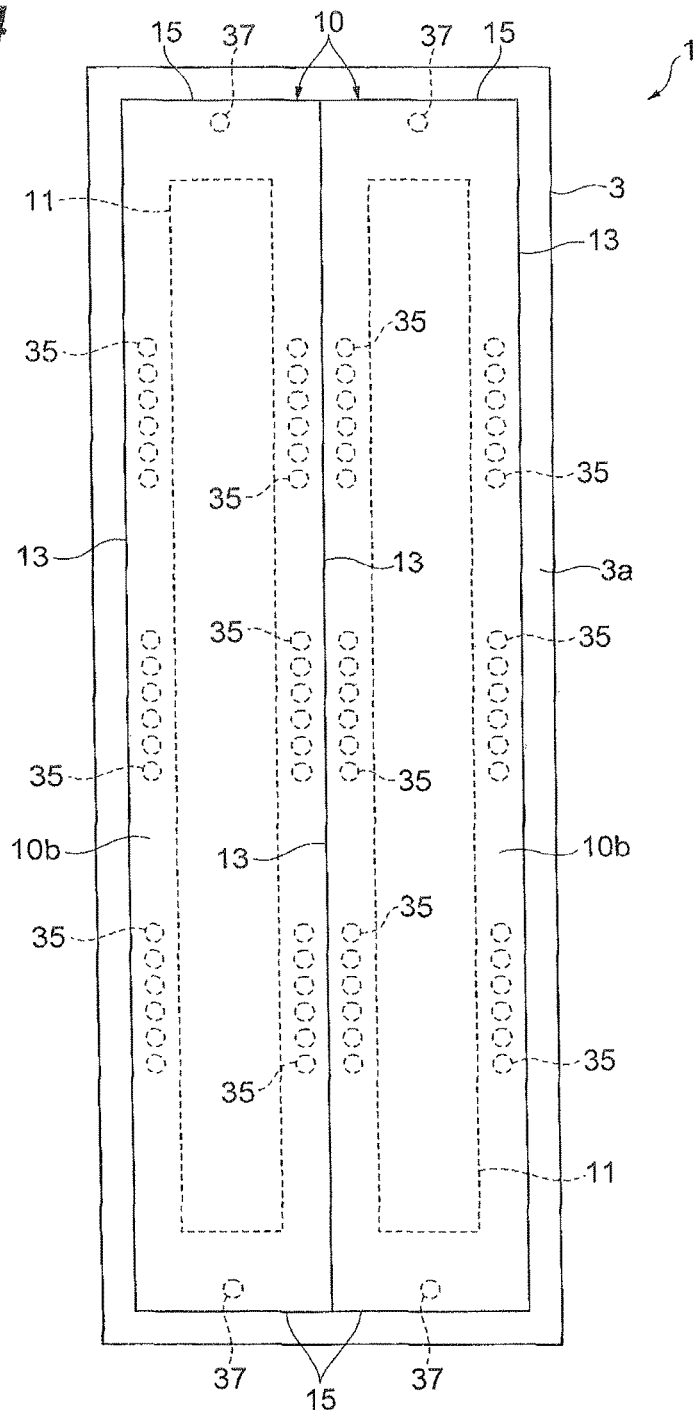
FIG. 4 is a plan view showing a semiconductor photodetecting device according to a modification example of the first embodiment.

In the modification example shown in FIG. 4, each dummy bump 37 is also disposed so that one dummy bump 37 is disposed on each of the sides where the pair of second sides 15 lie. In the present modification example, each dummy bump 37 is disposed at a position corresponding to a central portion of the second side 15.

Figure 5:
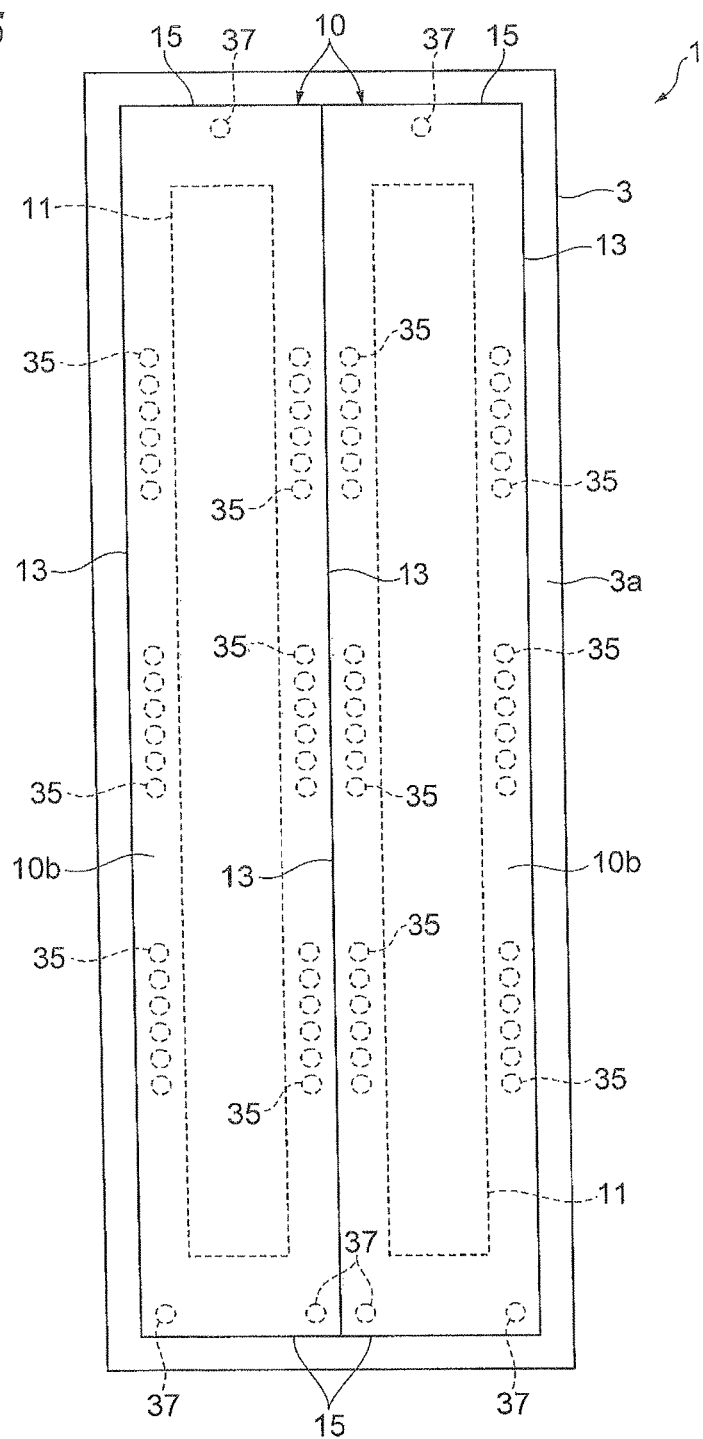
FIG. 5 is a plan view showing a semiconductor photodetecting device according to a modification example of the first embodiment.

In the modification example shown in FIG. 5, each dummy bump 37 is disposed so that one dummy bump 37 is disposed on each of the sides where the second sides 15 at one end lie and so that two dummy bumps 37 are disposed on each of the sides where the second sides 15 at the other end lie. In the present modification example, the dummy bumps 37 disposed on the sides where the second sides 15 at one end lie are disposed at positions corresponding to the respective central portions of the pertinent second sides 15. Each dummy bump 37 disposed on each of the sides where the second sides 15 at the other end lie is disposed at one of positions corresponding to the corners of the rectangle shape on the sides where the second sides 15 at the other end lie.

In the modification examples shown in FIGS. 3 to 5, just as in the aforementioned first embodiment, each semiconductor photodetecting element 10 is also prevented from undergoing the positional deviation and the two semiconductor photodetecting elements 10 are also disposed with high position accuracy. In each of the modification examples, each of the contact pads 7, 27 to which each dummy bump 37 is connected is also disposed at the position corresponding to the dummy bump 37 though not shown.

Figure 6:
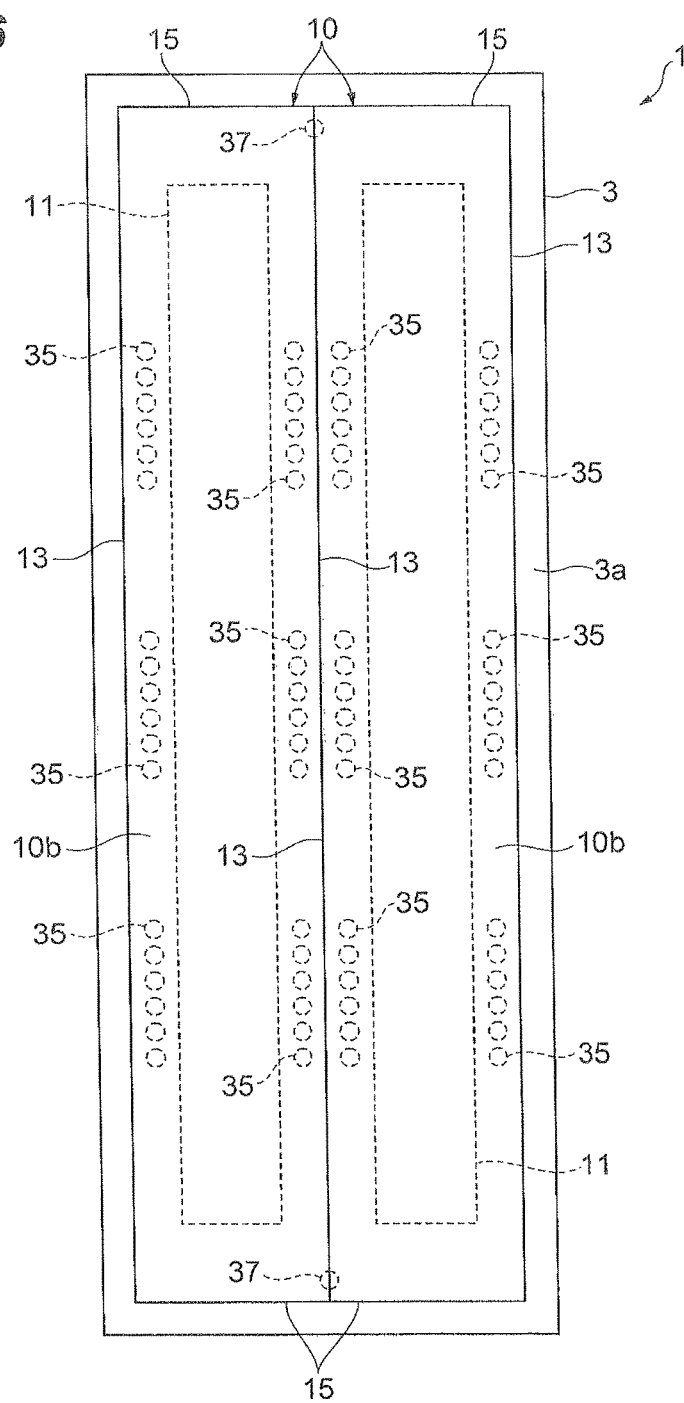
FIG. 6 is a plan view showing a semiconductor photodetecting device according to a modification example of the first embodiment.

In the modification example shown in FIG. 6, each dummy bump 37 is disposed so as to lie on the adjacent semiconductor photodetecting elements 10, on each of the sides where the pair of second sides 15 lie. In the present modification example, just as in the aforementioned first embodiment, each semiconductor photodetecting element 10 is also prevented from suffering the positional deviation and the two semiconductor photodetecting elements 10 are disposed with high position accuracy. Since the dummy bumps 37 are shared between the adjacent semiconductor photodetecting elements 10, the number of dummy bumps 37 is relatively small. This can suppress increase in cost. In the present modification example as well, each of the contact pads 7, 27 to which each dummy bump 37 is connected is also disposed at the position corresponding to the dummy bump 37 though not shown.

Figure 7:
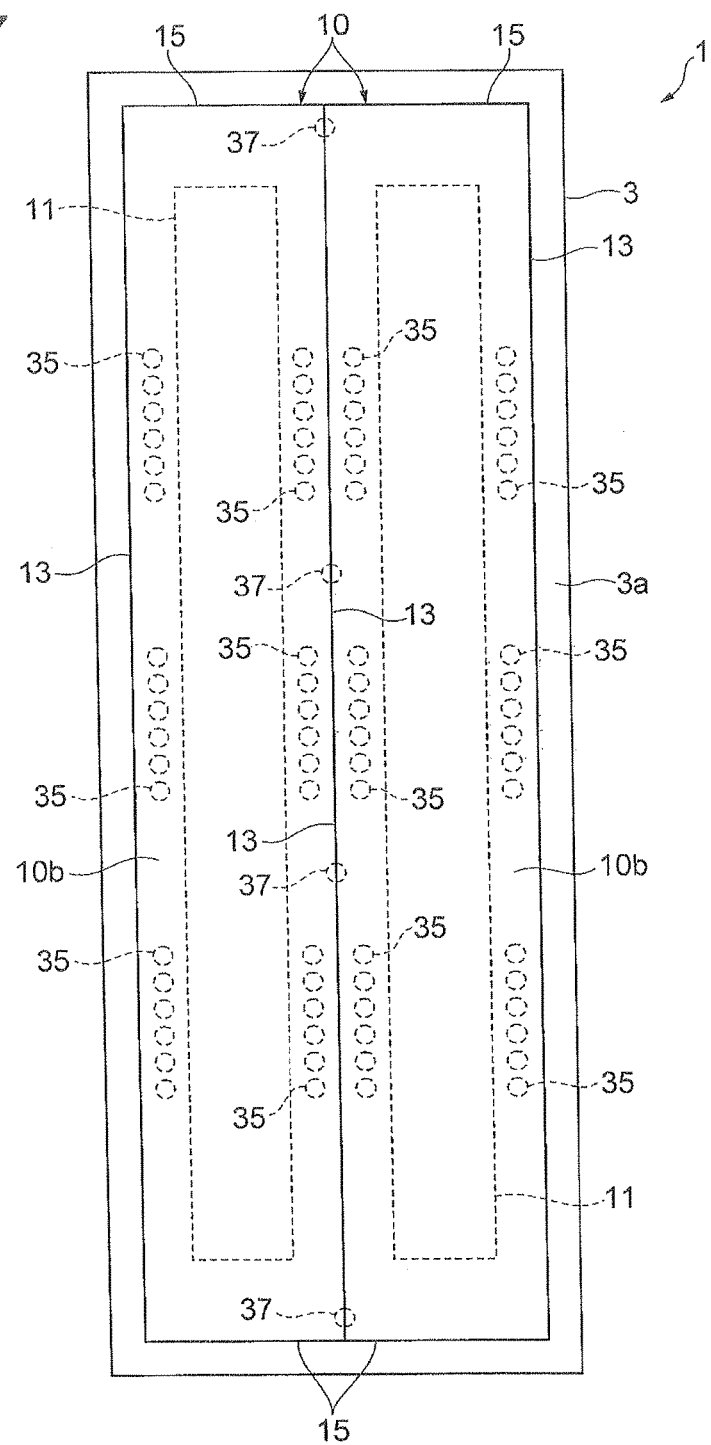
FIG. 7 is a plan view showing a semiconductor photodetecting device according to a modification example of the first embodiment.

In the modification example shown in FIG. 7, the plurality of dummy bumps 37 are also disposed on the sides where the first sides 13 lie, in addition to those on the sides where the pair of second sides 15 lie. In the present modification example, the two dummy bumps 37 are disposed so as to lie on the adjacent semiconductor photodetecting elements 10, on the sides where the first sides 13 lie. In the present modification example, each semiconductor photodetecting element 10 is further prevented from suffering the positional deviation and the two semiconductor photodetecting elements 10 are disposed with high position accuracy.

(Second Embodiment)

Figure 8:
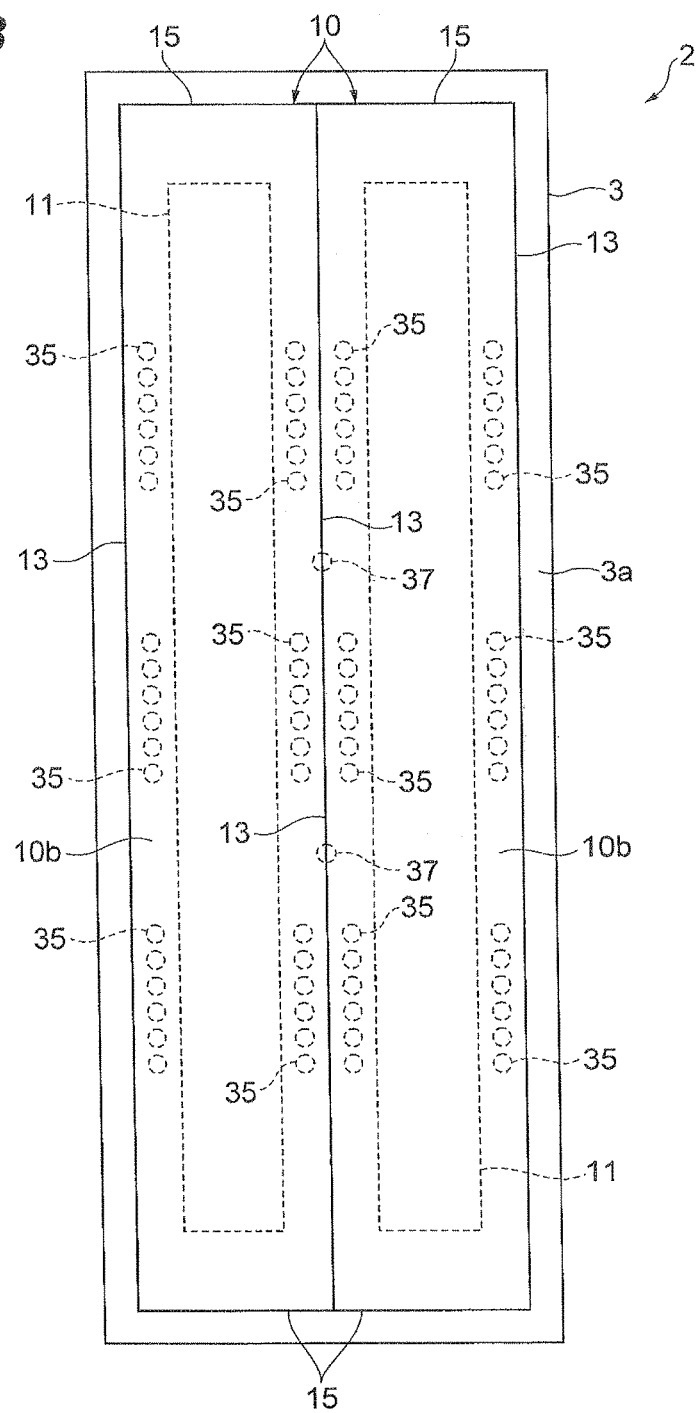
FIG. 8 is a plan view showing a semiconductor photodetecting device according to a second embodiment.
Figure 9:
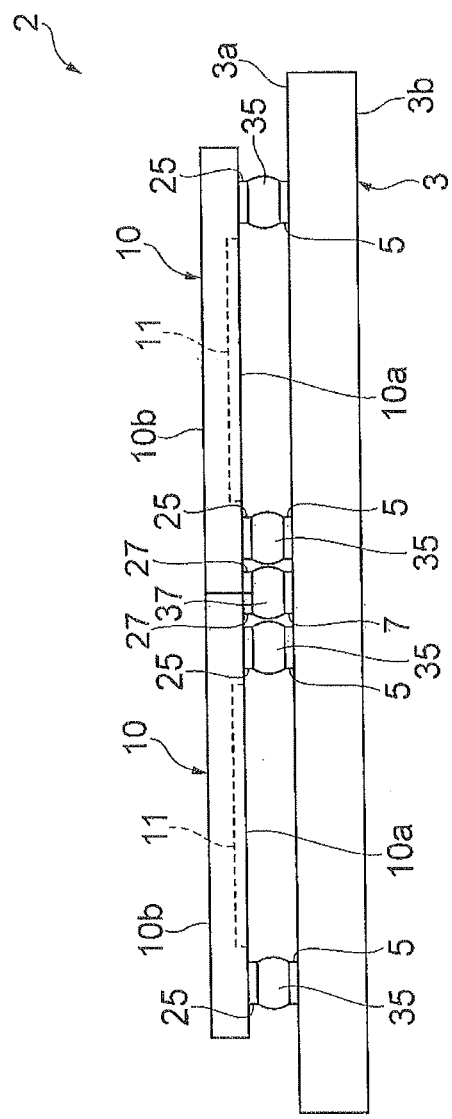
FIG. 9 is a drawing for explaining a cross-sectional configuration of the semiconductor photodetecting device according to the second embodiment.

A configuration of the semiconductor photodetecting device 2 according to the second embodiment will be described with reference to FIGS. 8 and 9. FIG. 8 is a plan view showing the semiconductor photodetecting device according to the second embodiment. FIG. 9 is a drawing for explaining a cross-sectional configuration of the semiconductor photodetecting device according to the second embodiment.

The semiconductor photodetecting device 2 has a base 3, and a plurality of semiconductor photodetecting elements 10, as shown in FIGS. 8 and 9. In the present embodiment, the semiconductor photodetecting device 1 has two semiconductor photodetecting elements 10.

The plurality of dummy bumps 37 are disposed so as to lie on each semiconductor photodetecting element 10 on the sides where the first sides 13 adjacent to each other lie in the adjacent semiconductor photodetecting elements 10. In the present second embodiment, two dummy bumps 37 are disposed so as to lie on the adjacent semiconductor photodetecting elements 10, on the sides where the first sides 13 lie.

In the present second embodiment, as described above, the two dummy bumps 37 are disposed so as to lie on the adjacent semiconductor photodetecting elements 10, on the sides where the first sides 13 lie. Even if each semiconductor photodetecting element 10 comes close to undergoing the positional deviation due to the factor such as the contraction of the plurality of bump electrodes 35, each semiconductor photodetecting element 10 will be prevented from suffering the positional deviation, because the dummy bumps 37 are disposed each so as to lie on each semiconductor photodetecting element 10 on the sides where the first sides 13 lie. Therefore, the two semiconductor photodetecting elements 10 are disposed with high position accuracy.

Each of the modification examples shown in FIGS. 6 and 7 also corresponds to a modification example of the present second embodiment, in that the plurality of dummy bumps 37 are disposed so as to lie on the adjacent semiconductor photodetecting elements 10, on the sides where the first sides 13 lie.

The above described the embodiments of the present invention but it should be noted that the present invention does not always have to be limited to the foregoing embodiments and can be modified in many ways without departing from the scope and spirit of the invention.

The bump electrodes 35 and the dummy bumps 37 may be made using the same solder bumps or using different solder bumps. For example, the dummy bumps 37 may be made using solder bumps with the melting point lower than that of the bump electrodes 35. In this case, the bump electrodes 35 start hardening earlier than the dummy bumps 37, while the dummy bumps 37 still remain molten. Therefore, the bump electrodes 35 become hardened while each semiconductor photodetecting element 10 is in alignment by surface tension of the dummy bumps 37. As a result, each semiconductor photodetecting element 10 is further prevented from suffering the positional deviation.

The bump electrodes 35 and the dummy bumps 37 may be different in size. For example, as shown in FIGS. 10 and 11, the dummy bumps 37 may be smaller than the bump electrodes 35. Not only the bump electrodes 35 but also the dummy bumps 37 undergo contraction during the hardening process. However, since the dummy bumps 37 are made smaller than the bump electrodes 35, a contraction percentage of the dummy bumps 37 is relatively small and an extremely small force is imposed on the semiconductor photodetecting elements 10 during the contraction thereof. Therefore, each semiconductor photodetecting element 10 is securely prevented from suffering the positional deviation. When the dummy bumps 37 are the solder bumps with the melting point lower than that of the bump electrodes 35, each semiconductor photodetecting element 10 can be more securely prevented from suffering the positional deviation.

Each semiconductor photodetecting element 10 is located so as to be adjacent to another in juxtaposition in the first direction on the principal surface 3a of the base 3, but does not have to be limited to this. For example, each semiconductor photodetecting element 10 may be located so as to be adjacent to another in juxtaposition in the second direction on the principal surface 3a of the base 3. In this case, the second side 15 of one semiconductor photodetecting element 10 is adjacent to the second side 15 of the other semiconductor photodetecting element 10.

The number of semiconductor photodetecting elements 10 does not have to be limited to the number described above, but the semiconductor photodetecting device 1 or 2 may have three or more semiconductor photodetecting elements 10. The numbers of bump electrodes 35 and dummy bumps 37 are not limited to the above-described numbers, either.

INDUSTRIAL APPLICABILITY

The present invention is applicable to the semiconductor photodetecting devices having a plurality of semiconductor photodetecting elements.

REFERENCE SIGNS LIST 1, 2 semiconductor photodetecting devices; 3 base; 5, 7 contact pads; 10 semiconductor photodetecting elements; 13 first sides; 15 second sides; 25, 27 contact pads; 35 bump electrodes; 37 dummy bumps.

The invention claimed is:

1. A semiconductor photodetecting device, comprising:
   a base including first and second principal surfaces opposed to each other;
   a first and a second semiconductor photodetecting elements that have a planar shape, when viewed from a direction perpendicular to the first principal surface, having a pair of first sides opposed to each other in a first direction and a pair of second sides being shorter than the pair of first sides and opposed to each other in a second direction perpendicular to the first direction, and that are disposed on the first principal surface, the first semiconductor photodetecting element being a seperate element from, the second semiconductor photodetecting element and juxtaposed to the second semiconductor photodetecting element in the first direction in such a manner that the first sides are in contact with each other;
   a plurality of bump electrodes each disposed on sides where the pair of first sides lie in each of the first and second semiconductor photodetecting elements, to electrically and mechanically connect the base and each of the first and second semiconductor photodetecting elements; and
   a plurality of dummy bumps disposed so that at least one dummy bump is disposed on each of sides where the pair of second sides lie in each of the first and second semiconductor photodetecting elements, to mechanically connect the base and each of the first and second semiconductor photodetecting elements.

2. The semiconductor photodetecting device according to claim 1,
   wherein the plurality of dummy bumps are disposed so as to lie on the first and second semiconductor photodetecting elements.

3. The semiconductor photodetecting device according to claim 1, further comprising:
   at least one dummy bump simultaneously in contact with bottom surfaces of both the first and second semiconductor photodetecting elements and disposed to lie simultaneously beneath the first surfaces of both of the first and second semiconductor photodetecting elements, to mechanically connect the base and each of the first and second semiconductor photodetecting elements.

4. A semiconductor photodetecting device, comprising:
   a base including first and second principal surfaces opposed to each other;
   a first and a second semiconductor photodetecting elements that have a planar shape, when viewed from a direction perpendicular to the first principal surface, having a pair of first sides opposed to each other in a first direction and a pair of second sides opposed to each other in a second direction perpendicular to the first direction, and that are disposed on the first principal surface, the first semiconductor photodetecting element being a separate element from the second semiconductor photodetecting element and juxtaposed to the second semiconductor photodetecting element in the first direction in such a manner that the first sides are in contact with each other;

a plurality of bump electrodes each disposed on sides where the pair of first sides lie in each of the first and second semiconductor photodetecting elements, to electrically and mechanically connect the base and each of the first and second semiconductor photodetecting elements; and a plurality of dummy bumps simultaneously in contact with bottom surfaces of both the first and second semiconductor photodetecting elements and disposed to lie simultaneously beneath the first surfaces of both of the first and second semiconductor photodetecting elements, to mechanically connect the base and each of the first and second semiconductor photodetecting elements.

5. The semiconductor photodetecting device according to claim 4,
wherein a plurality of contact pads that are formed by the same manufacturing process and to which the plurality of bump electrodes and the plurality of dummy bumps are connected are disposed on the first and second semiconductor photodetecting elements.

6. The semiconductor photodetecting device according to claim 4,
wherein the plurality of bump electrodes are solder bumps, and
wherein the plurality of dummy bumps are solder bumps with a melting point lower than that of the plurality of bump electrodes.

7. The semiconductor photodetecting device according to claim 4,
wherein the plurality of dummy bumps are smaller than the plurality of bump electrodes.

8. The semiconductor photodetecting device according to claim 4,
wherein each of the first and second semiconductor photodetecting elements is a solid-state imaging device capable of acquiring a two-dimensional image with a longitudinal direction along the second direction and being driven by TDI driving.

9. The semiconductor photodetecting device according to claim 1,
wherein a plurality of contact pads that are formed by the same manufacturing process and to which the plurality of bump electrodes and the plurality of dummy bumps are connected are disposed on the first and second semiconductor photodetecting elements.

10. The semiconductor photodetecting device according to claim 1,
wherein the plurality of bump electrodes are solder bumps, and
wherein the plurality of dummy bumps are solder bumps with a melting point lower than that of the plurality of bump electrodes.

11. The semiconductor photodetecting device according to claim 1,
wherein the plurality of dummy bumps are smaller than the plurality of bump electrodes.

12. The semiconductor photodetecting device according to claim 1,
wherein each of the first and second semiconductor photodetecting elements is a solid-state imaging device capable of acquiring a two-dimensional image with a longitudinal direction along the second direction and being driven by TDI driving.

* * * * *